(12) United States Patent
Zhang et al.

(10) Patent No.: US 9,979,417 B2
(45) Date of Patent: May 22, 2018

(54) ENHANCED CHIP-KILL SCHEMES BY USING ECC SYNDROME PATTERN

(71) Applicant: Sk hynix Inc., Gyeonggi-do (KR)

(72) Inventors: Fan Zhang, Fremont, CA (US); June Lee, Sunnyvale, CA (US); Yu Cai, San Jose, CA (US)

(73) Assignee: SK Hynix Inc., Gyeonggi-do (KR)

( * ) Notice: Subject to any disclaimer, the term of this patent is extended or adjusted under 35 U.S.C. 154(b) by 63 days.

(21) Appl. No.: 15/184,860

(22) Filed: Jun. 16, 2016

(65) Prior Publication Data

US 2016/0373137 A1    Dec. 22, 2016

Related U.S. Application Data

(60) Provisional application No. 62/180,510, filed on Jun. 16, 2015.

(51) Int. Cl.
*H03M 13/29* (2006.01)
*H03M 13/15* (2006.01)
*G06F 11/10* (2006.01)
*H03M 13/05* (2006.01)

(52) U.S. Cl.
CPC ......... *H03M 13/2948* (2013.01); *G06F 11/10* (2013.01); *H03M 13/05* (2013.01); *H03M 13/1575* (2013.01)

(58) Field of Classification Search
CPC .................. H03M 13/2948; H03M 13/1575
See application file for complete search history.

(56) References Cited

U.S. PATENT DOCUMENTS

| | | | | |
|---|---|---|---|---|
| 3,745,526 A * | 7/1973 | Hong | ............... | H03M 13/19 714/777 |
| 4,916,702 A * | 4/1990 | Berlekamp | ......... | H03M 13/17 714/762 |
| 5,712,861 A * | 1/1998 | Inoue | ............... | H03M 13/151 714/752 |
| 5,951,677 A * | 9/1999 | Wolf | ............... | G06F 9/30007 712/11 |
| 6,047,395 A * | 4/2000 | Zook | ............... | G11B 20/1833 714/755 |
| 6,272,659 B1 * | 8/2001 | Zook | ............... | H03M 13/1515 714/763 |
| 6,405,342 B1 * | 6/2002 | Lee | ............... | G11B 20/1866 714/792 |
| 6,611,939 B1 * | 8/2003 | Noguchi | ......... | G11B 20/1833 714/764 |
| 6,625,774 B1 * | 9/2003 | Yang | ............... | H03M 13/09 714/755 |
| 7,307,902 B2 | 12/2007 | Thayer | | |
| 9,136,877 B1 | 9/2015 | Chen et al. | | |

\* cited by examiner

*Primary Examiner* — Joseph D Torres
(74) *Attorney, Agent, or Firm* — IP & T Group LLP

(57) ABSTRACT

Memory systems may include a memory storage, and a controller suitable for receiving a plurality of codewords, determining whether each codeword is decodable, estimating a location of an error in a codeword determined to be undecodable by calculating a syndrome of the undecodable codeword when at least two codewords of the plurality of codewords are determined to be undecodable, performing error recovery on the undecodable codewords, and hard decoding the plurality of codewords including the error recovered codewords.

12 Claims, 5 Drawing Sheets

ENHANCED CHIP-KILL SCHEMES BY USING ECC SYNDROME PATTERN

CROSS-REFERENCE TO RELATED APPLICATIONS

This application claims the benefit of U.S. Provisional Application No. 62/180,510 filed Jun. 16, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

In memory devices, chip-kill schemes have been implemented. There exists a need for improved chip-kill schemes that can recover data at a higher rate.

SUMMARY

Aspects of the invention include memory systems. The memory systems may include a memory storage, and a controller suitable for receiving a plurality of codewords, determining whether each codeword is decodable, estimating a location of an error in a codeword determined to be undecodable by calculating a syndrome of the undecodable codeword when at least two codewords of the plurality of codewords are determined to be undecodable, performing error recovery on the undecodable codewords, and hard decoding the plurality of codewords including the error recovered codewords.

Further aspects of the invention include methods. The methods may include receiving, with a controller, a plurality of codewords, determining, with the controller, whether each codeword is decodable, estimating, with the controller, a location of an error in a codeword determined to be undecodable by calculating a syndrome of the undecodable codeword when at least two codewords of the plurality of codewords are determined to be undecodable, performing, with the controller, error recovery on the undecodable codewords, and hard decoding the plurality of codewords including the error recovered codewords.

Additional aspects of the invention include memory devices. The memory devices may include a memory storage, and a controller configured to receive a plurality of codewords, determine whether each codeword is decodable, estimate a location of an error in a codeword determined to be undecodable by calculating a syndrome of the undecodable codeword when at least two codewords of the plurality of codewords are determined to be undecodable, perform error recovery on the undecodable codewords, and hard decode the plurality of codewords including the error recovered codewords.

DETAILED DESCRIPTION

Figure 1:
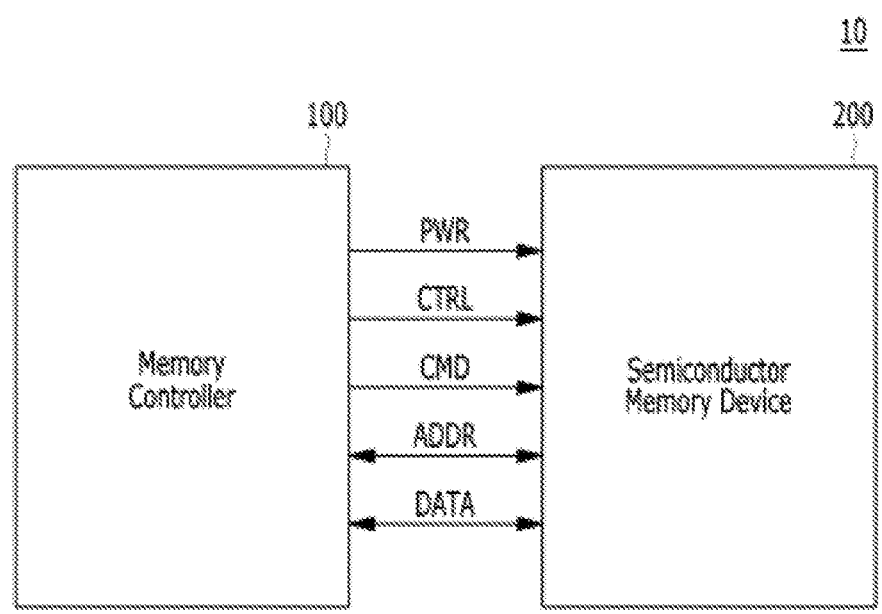
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
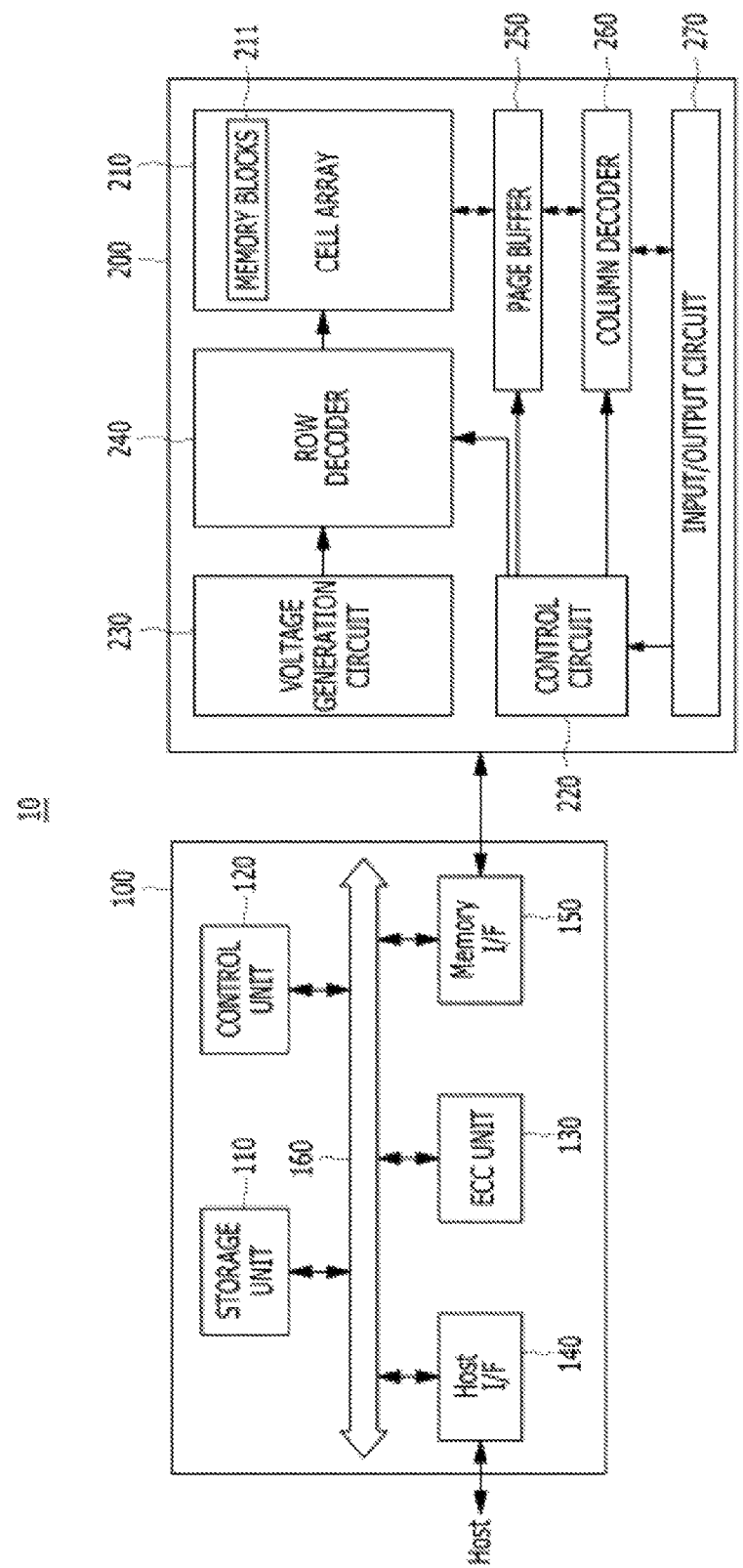
FIG. 2 is a block diagram illustrating a memory system in accordance with an embodiment of the present invention.

FIG. 2 is a detailed block diagram Illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fall signal indicating failure in correcting the error bits.

In some embodiments, the ECC unit 130 may perform an error correction operation based on a coded modulation such as a low density parity check (LDPC) code, a Bose-Chaudhurl-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an Interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
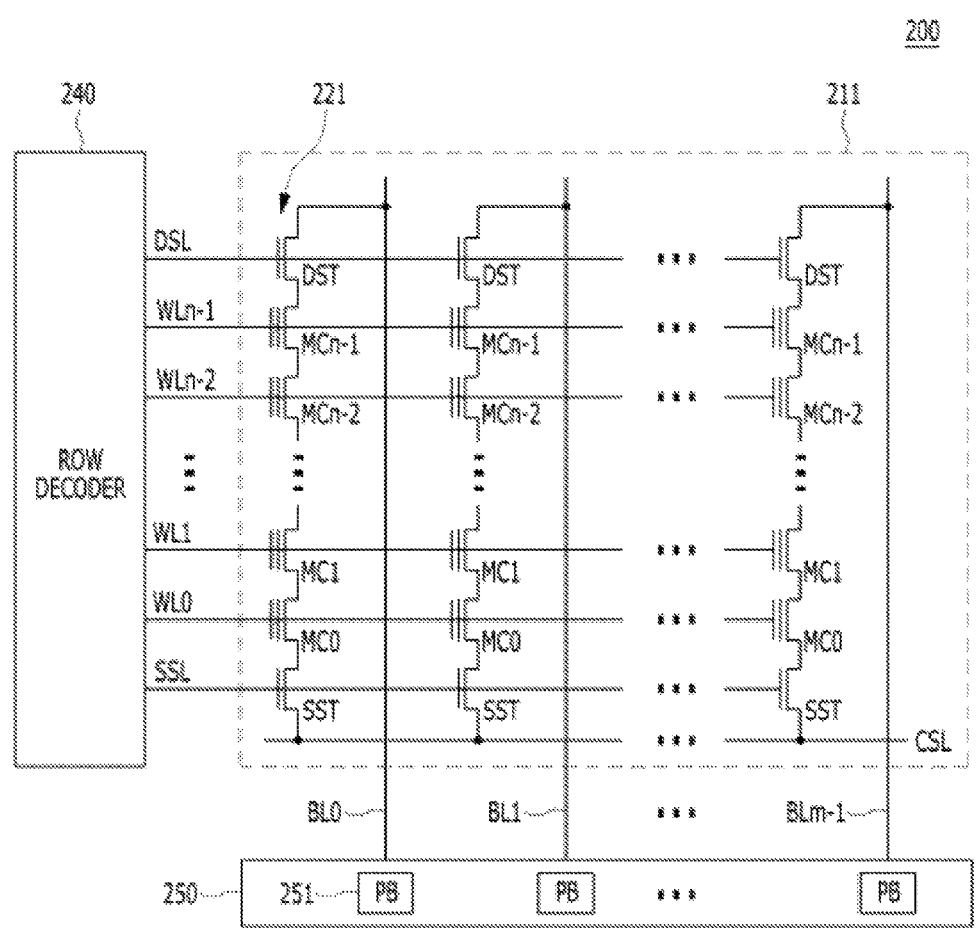
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
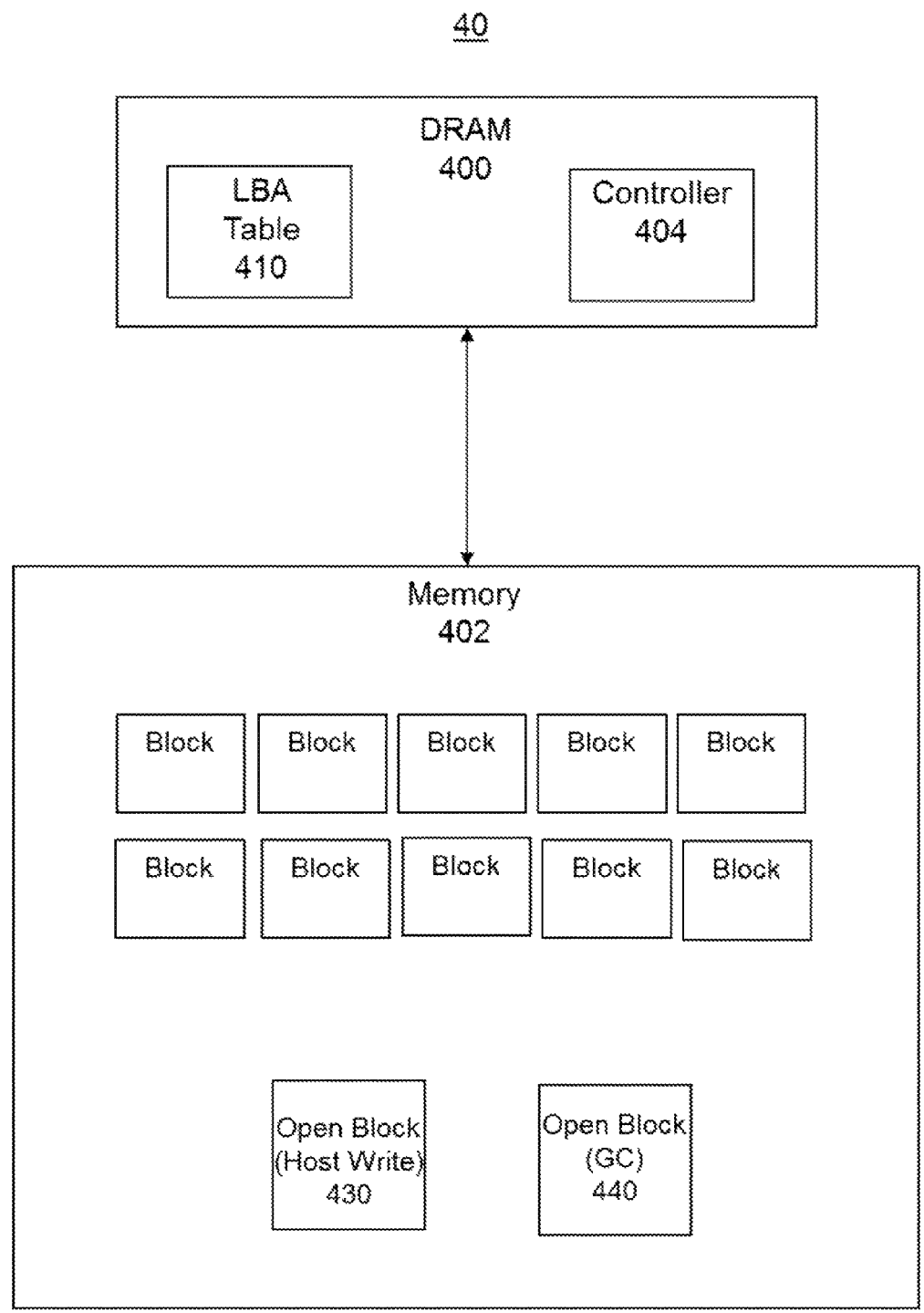
FIG. 4 is a diagram of an example memory system according to aspects of the invention.

FIG. 4 is a diagram of a memory system 40 in accordance with embodiments of the invention. The memory system 40 may include a DRAM 400 and a memory portion/storage 402. The DRAM 400 may include a controller 404 (such as those described above) and an LBA table 410. The controller 404 may be configured to carry out the functionality of the methods, processes, systems, and devices disclosed herein. The memory 402 may include a plurality of memory blocks, an open block for host writes 430, and an open block for garbage collection 440. The DRAM 400 and the memory 402 may be configured to be in communication.

Chip-kill techniques have been implemented as a last error recovery resort to ensure data integrity. In other words, any error which cannot be corrected by chip-kill will lead to user data loss from an SSD drive perspective, or the reliability of our SSD drive is determined by the error correction capability of chip-kill scheme. A modified chip-kill scheme is disclosed herein that achieves improved error correction capability without any extra NAND/memory reads and with only a slight increase of latency and power.

Previous chip-kill schemes are basically a single parity check code which can protect any 1 node failure in a stripe. In the write path, it takes k trunks of ECC encoded information and sums them together to generate a parity trunk. A trunk can be a codeword, or multiple codewords (for illustration purposes, it is assumed that each trunk contains at least one codeword). The k+1 trucks of data, which is called a data stripe, is then written into the memory/NAND. In the read path, if a trunk cannot be successfully decoded, the controller will read all other trucks of data on the same stripe. If all other trunks of data can be successfully decoded, the uncorrectable trunk can be recovered by summing up all the other trunks of data. If there are two or more uncorrectable trunks of data in a stripe, the recovery algorithm will declare a failure. The chip-kill scheme is also called (k, 1) chip-kill scheme where 1 parity trunk is generated in every k data trunks. Any single trunk error can be recovered by XOR-ing other k trunks of data.

Traditional chip-kill schemes can only correct 1 truck error by using 1 parity trunk. When two or more trunks are in error, the invention disclosed herein uses syndrome patterns in the error trunks to estimate the locations of the errors and/or the location of the erroneous sub-trunks. By knowing the location of the errors, some errors may be corrected by XOR-ing the correct bits on other trunks and then applying another round of decoding to the error trunks. The disclosed scheme can correct more than 1 trunk failure by having only 1 parity trunk.

As an example, a codeword of an ECC scheme is denoted as c, which is of length n, and the parity-check matrix as H, which is an m by n matrix over GF(2). The syndrome s of a noisy codeword $c'=c+e$, where e is the error vector, is defined as the product of c' and $H^T$: $s=c'H^T$, where $^T$ denotes transposition of a matrix. Thus, $s=eH^T$. Syndromes may be used as a rough indicator of the location of the error bits, or where those is are located in e. A syndrome is a length m vector.

For example, in a (7,4) Hamming code, which has a parity check matrix as followed:

$$H = \begin{bmatrix} 1 & 0 & 0 & 1 & 1 & 0 & 1 \\ 0 & 1 & 0 & 1 & 0 & 1 & 1 \\ 0 & 0 & 1 & 0 & 1 & 1 & 1 \end{bmatrix}.$$

The syndrome s=[0, 1, 0] indicates a single bit error at the second bit of c' may occur. If the syndrome is s=[1, 1, 1], there may be a single bit error at the 7-th bit of c' and so on.

In general, non-zero syndromes tend to be connected to errors with higher probability than correct bits. This is particularly true for LDPC codes with low column weight. For example, LDPC codes may have only 5 ones in every column, which has around 600 bits.

In the chip-kill schemes disclosed herein, syndromes are used as the error locator to get some estimation about the error locations. Then, a subset-parity check sum may be used to recover the erroneous bits.

Figure 5:
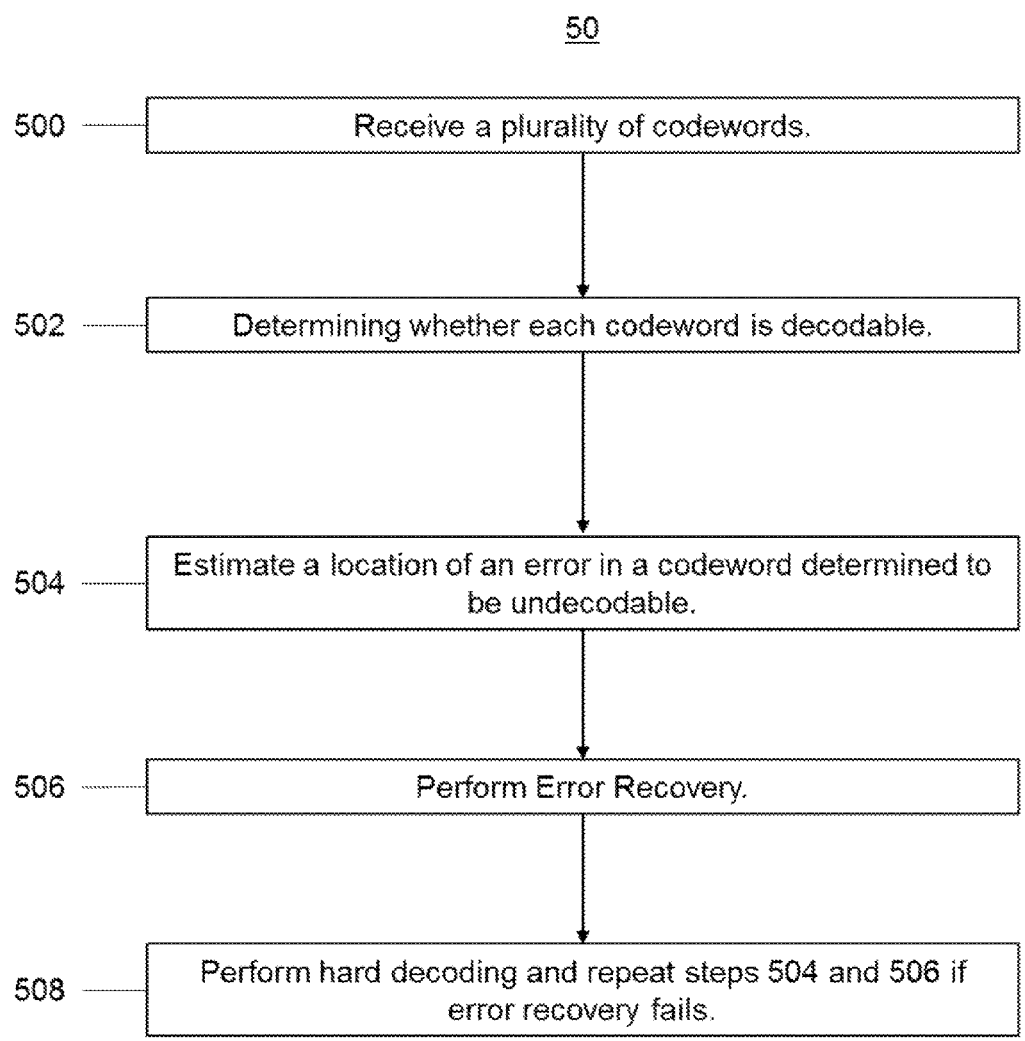
FIG. 5 is a flowchart of steps in a method for data recovery in accordance with aspects of the invention.

Referring next to FIG. 5, a flowchart 50 of steps for decoding erroneous codewords. At step 500, a plurality of codewords are received (e.g., by the controller), or alternatively, generated by the controller. At step 502, the controller may determine whether each codeword (e.g., each trunk) is decodable. For example, a codeword may be determined to be undecodable when at least one bit in the codeword is an error bit (e.g., hard decoding of the codeword falls).

At step 504, the controller may estimate the location of an erroneous bit in a codeword determined to be undecodable using a syndrome. At step 506, error recovery is performed. At step 508, hard decoding is then performed on the codewords and steps 504 and 506 may be repeated if hard decoding fails following error recovery.

Referring back to steps 504 and 506, the controller may be configured to take different steps when two codewords fail and when more than two codewords fail. For example, when two codewords fail (e.g., codeword 1 and codeword 2), the controller may be configured to estimate the error location (e.g., step 504) by calculating the syndrome using decoder output c' and the parity check matrix $H^T$, or $s=c'H^T$.

The syndrome of codeword 1 is denoted as $s_1$ and the syndrome of codeword 2 is denoted as $s_2$. The set of indices of the non-zero entries in $s_1$ is denoted as $E_1$ and the set of indices of the non-zero entries in $s_2$ is denoted as $E_2$. The intersection of $E_1$ and $E_2$ is denoted as $E_{1\cap 2}=E_1 \cap E_2$. E is denoted as a subset of the syndrome. The indices of bits which are connected to E are denoted as $B_E$.

Next, the error recovery (step 506) may be performed as followed. For bits in codeword 1 with indices in $B_{E2-E1\cap 2}$, a check-sum error recovery may be performed by summing up all bits with the same indices from codeword 2 to codeword k+1. In the same way, for bits in codeword 2 with indices in $B_{E2-E1\cap 2}$, the check-sum error recovery may be performed by summing up all bits with the same indices from codeword 1, codeword 3 up to codeword k+1.

Thus, hard decoding (e.g., step 508) may be conducted as followed. Some of the decoder output hard decision bits are flipped, and the hard bit codeword after the error recovery is denoted as c". Thus, the controller will pass $c_1$" and $c_2$" to hard decoder. If the decoding succeeds in both codeword 1 and 2, the error recovery is declared successful. Otherwise, steps 504 and 506 may be repeated again until a maximum number of iteration is reached. If the errors cannot be recovered after reaching a maximum number of iterations, an error recovery failure may be declared.

When more than two codewords fail, such as codeword $i_1$, $i_2, \ldots, i_j$, the controller may be configured to estimate the location of the errors (e.g., step 504) by calculating the syndrome using decoder output c' and the parity check matrix $H^T$, or $s=c'H^T$. The syndrome of codeword $i_l$ is denoted as $s_{il}$. The set of indices of the non-zero entries in $s_l$ is denoted as $E_{il}$. The recoverable syndrome indices of codeword $i_l$ is denoted as $R_{il}=E_{il}-(E_{il} \cap (\cup_{q \in |1, 2, \ldots, j|/l} E_{i_q}))$. The Indices of bits which are connected to $R_{il}$ are denoted as $B_{Ri\,l}$.

Thus, at step 506, the error recovery may be performed as, for l=1, 2, . . . j, a check-sum error recovery to the bits in codeword $i_l$ with indices in $B_{Ri\,l}$, by summing up all bits with the same indices from other k codewords.

Next, the hard decoding (step 508) may be performed as followed. Some of the decoder output hard decision bits are flipped following the error recovery process, and the hard bit codeword after step 506 is denoted as c". In step 508, the controller will pass $c_{il}$", where l=1, 2, . . . , j, to hard decoder. If the decoding succeed in all erroroeous codewords, the error recovery is declared successful. Otherwise, steps 504 and 506 are repeated until a maximum number of Iteration is reached. If the errors are not recovered after reaching the maximum number of Iterations, an error recovery failure may be declared.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A memory system, comprising:
   a memory device;
   a processor; and
   a non-transitory computer readable storage medium coupled to the processor, embedding computer program products executed by the processor, including computer instructions configured to:
   control the memory device including
   a memory storage; and a controller coupled with the memory storage and configured to:
receive a plurality of codewords;
determine whether each of the plurality of codewords is decodable;
when at least two codewords of the plurality of codewords are determined to be undecodable, calculate syndromes of the at least two undecodable codewords, and estimate error location using the calculated syndromes of the at least two undecodable codewords, wherein the at least two undecodable codewords have sets of indices of non-zero entries in the syndromes, respectively, the error location is an intersection of the sets of indices of non-zero entries in the syndromes, and the intersection denotes a subset of syndromes of the at least two undecodable codewords;
perform error recovery on the at least two undecodable codewords using at least the error location, wherein the error recovery recovers more than one undecodable codewords by using only one set of indices of non-zero entries in the syndromes without extra read from the memory storage, and the only one set of indices of non-zero entries in the syndromes is the intersection or the subset of syndromes; and
hard decode the plurality of codewords including the error recovered codewords.

2. The memory system of claim 1, wherein the error recovery is performed as a check-sum error recovery.

3. The memory system of claim 1, wherein the controller is further suitable for repeating the estimating, performing, and hard decoding when the hard decoding of the plurality of codewords fails.

4. The memory system of claim 3, wherein the controller is further suitable for declaring an error recovery failure when a number of times hard decoding is performed reaches a maximum number of iterations.

5. A method of operating a memory system including a memory device and a processor, comprising:
receiving, with a controller, a plurality of codewords;
determining, with the controller, whether each of the plurality of codewords is decodable;
when at least two codewords of the plurality of codewords are determined to be undecodable, with the controller, calculating syndromes of the at least two undecodable codewords, and estimating error location using the calculated syndromes of the at least two undecodable codewords, wherein the at least two undecodable codewords have sets of indices of non-zero entries in the syndromes, respectively, the error location is an intersection of the sets of indices of non-zero entries in the syndromes, and the intersection denotes a subset of syndromes of the at least two undecodable codewords;
performing, with the controller, error recovery on the at least two undecodable codewords using at least the error location, wherein the error recovery recovers more than one undecodable codewords by using only one set of indices of non-zero entries in the syndromes without extra read from the memory storage, and the only one set of indices of non-zero entries in the syndromes is the intersection or the subset of syndromes; and
hard decoding the plurality of codewords including the error recovered codewords.

6. The method of claim 5, wherein the error recovery is performed as a check-sum error recovery.

7. The method of claim 5, further comprising repeating the estimating, performing, and hard decoding when the hard decoding of the plurality of codewords fails.

8. The method of claim 7, further comprising declaring an error recovery failure when a number of times hard decoding is performed reaches a maximum number of iterations.

9. A memory device, comprising:
a memory storage; and
a controller coupled with the memory storage and configured to:
receive a plurality of codewords;
determine whether each of the plurality of codewords is decodable;
when at least two codewords of the plurality of codewords are determined to be undecodable, calculate syndromes of the at least two undecodable codewords, and estimate error location using the calculated syndromes of the at least two undecodable codewords, wherein the at least two undecodable codewords have sets of indices of non-zero entries in the syndromes, respectively, the error location is an intersection of the sets of indices of non-zero entries in the syndromes, and the intersection denotes a subset of syndromes of the at least two undecodable codewords;
perform error recovery on the at least two undecodable codewords using at least the error location, wherein the error recovery recovers more than one undecodable codewords by using only one set of indices of non-zero entries in the syndromes without extra read from the memory storage, and the only one set of indices of non-zero entries in the syndromes is the intersection or the subset of syndromes; and
hard decode the plurality of codewords including the error recovered codewords.

10. The memory device of claim 9, wherein the error recovery is performed as a check-sum error recovery.

11. The memory device of claim 9, wherein the controller is further configured to repeat the estimating, performing, and hard decoding when the hard decoding of the plurality of codewords fails.

12. The memory device of claim 11, wherein the controller is further configured to declare an error recovery failure when a number of times hard decoding is performed reaches a maximum number of iterations.

* * * * *